US010615581B2

(12) United States Patent
Knudson et al.

(10) Patent No.: US 10,615,581 B2
(45) Date of Patent: Apr. 7, 2020

(54) WOVEN EMI AND ABRASION RESISTANT SLEEVE AND METHOD OF CONSTRUCTION THEREOF

(71) Applicant: Federal-Mogul Powertrain, LLC, Southfield, MI (US)

(72) Inventors: Michael Knudson, Mohnton, PA (US); Yi Li, Lansdale, PA (US); Daniel Neff, Havertown, PA (US)

(73) Assignee: Federal-Mogul Powertrain, LLC, Southfield, MI (US)

( * ) Notice: Subject to any disclaimer, the term of this patent is extended or adjusted under 35 U.S.C. 154(b) by 42 days.

(21) Appl. No.: 15/944,708

(22) Filed: Apr. 3, 2018

(65) Prior Publication Data
US 2018/0287357 A1   Oct. 4, 2018

Related U.S. Application Data

(60) Provisional application No. 62/481,595, filed on Apr. 4, 2017.

(51) Int. Cl.
*H02G 3/04*   (2006.01)
*H01R 4/70*   (2006.01)
(Continued)

(52) U.S. Cl.
CPC ......... *H02G 3/0481* (2013.01); *D03D 1/0058* (2013.01); *D03D 15/0005* (2013.01);
(Continued)

(58) Field of Classification Search
None
See application file for complete search history.

(56) References Cited

U.S. PATENT DOCUMENTS 4,557,968 A * 12/1985 Thornton ............. B01D 39/083
442/198
4,606,968 A *  8/1986 Thornton ............. B01D 39/083
442/187
(Continued)

FOREIGN PATENT DOCUMENTS

WO   2014138742 A1   9/2014
WO   2016101022 A2   6/2016
WO   2016168794 A1   10/2016

OTHER PUBLICATIONS

International Search Report, dated Jun. 27, 2018 (PCT/US2018/025977).

*Primary Examiner* — Timothy J Thompson
*Assistant Examiner* — Muhammed Azam
(74) *Attorney, Agent, or Firm* — Robert L. Stearns; Dickinson Wright, PLLC

(57) ABSTRACT

A textile sleeve for protecting elongate members against EMI and method of construction thereof is provided. The sleeve includes a wall having opposite edges extending lengthwise in generally parallel relation with a longitudinal axis between opposite ends. The opposite edges are configured to overlap one another to bound a central cavity extending between the opposite ends. The wall includes warp filaments, extending generally parallel to the longitudinal axis, woven with weft filaments, extending generally transversely to the warp filaments. The warp filaments include substantially electrically non-conductive multifilaments woven in a plain weave pattern with the weft filaments and electrically conductive members woven with the weft filaments to form a plurality of floats, with each of the floats extending over at least two adjacent ones of the weft filaments.

28 Claims, 4 Drawing Sheets

(51) Int. Cl.
*D03D 1/00* (2006.01)
*H05K 9/00* (2006.01)
*H02G 15/18* (2006.01)
*D03D 15/00* (2006.01)
*H01B 3/50* (2006.01)
*H01R 13/6581* (2011.01)

(52) U.S. Cl.
CPC ............. *H01B 3/50* (2013.01); *H01R 4/70* (2013.01); *H02G 15/18* (2013.01); *H05K 9/009* (2013.01); *H05K 9/0098* (2013.01); *D03D 1/0035* (2013.01); *H01R 13/6581* (2013.01)

(56) References Cited

U.S. PATENT DOCUMENTS

| | | | | |
|---|---|---|---|---|
| 4,741,087 A * | 5/1988 | Plummer, Jr. | ...... | B29C 61/0658 138/123 |
| 5,229,176 A | 7/1993 | Freeman | | |
| 5,827,997 A * | 10/1998 | Chung | ...... | C08K 9/02 174/388 |
| 6,045,884 A * | 4/2000 | Hess | ...... | D03D 3/02 138/123 |
| 6,219,906 B1 * | 4/2001 | Sosnowski | ...... | D04B 1/225 174/393 |
| 6,963,031 B2 | 11/2005 | Gladfelter et al. | | |
| 7,078,615 B2 | 7/2006 | Gladfelter et al. | | |
| 9,307,685 B2 | 4/2016 | Harris et al. | | |
| 9,548,596 B2 * | 1/2017 | Avula | ...... | B60R 16/0215 |
| 9,816,208 B2 * | 11/2017 | Woodruff | ...... | D03D 1/0035 |
| 9,909,237 B2 * | 3/2018 | Woodruff | ...... | H02G 15/18 |
| 10,132,012 B2 * | 11/2018 | Thomas | ...... | D02G 3/38 |
| 10,196,194 B2 * | 2/2019 | Yamaguchi | ...... | F16L 57/06 |
| 10,202,714 B2 * | 2/2019 | Fathallah | ...... | D04C 1/06 |
| 10,211,612 B2 * | 2/2019 | Yamaguchi | ...... | F16L 57/06 |
| 2002/0195260 A1 * | 12/2002 | Marks | ...... | D04C 1/06 174/351 |
| 2006/0054346 A1 | 3/2006 | Gladfelter et al. | | |
| 2006/0264137 A1 * | 11/2006 | Ishihara | ...... | D04B 1/14 442/304 |
| 2007/0215232 A1 * | 9/2007 | Hassonjee | ...... | B32B 3/08 139/425 R |
| 2007/0243356 A1 * | 10/2007 | Baer | ...... | B32B 3/02 428/99 |
| 2007/0275199 A1 * | 11/2007 | Chen | ...... | D02G 3/441 428/36.1 |
| 2010/0084179 A1 * | 4/2010 | Harris | ...... | D02G 3/441 174/350 |
| 2012/0037263 A1 * | 2/2012 | Malloy | ...... | D03D 3/00 139/387 R |
| 2014/0262478 A1 * | 9/2014 | Harris | ...... | H05K 9/009 174/393 |
| 2014/0305536 A1 * | 10/2014 | Gao | ...... | H05B 3/03 139/291 C |
| 2014/0360772 A1 * | 12/2014 | Coppola | ...... | F16J 15/064 174/390 |
| 2016/0021799 A1 * | 1/2016 | Harris | ...... | H05K 9/009 174/350 |
| 2016/0201232 A1 | 7/2016 | Harris et al. | | |
| 2016/0309626 A1 * | 10/2016 | Simoens-Seghers | ...... | D03D 15/12 |
| 2017/0175304 A1 * | 6/2017 | Woodruff | ...... | D03D 1/0035 |
| 2017/0207005 A1 * | 7/2017 | Khosroshahi | ...... | H01B 7/18 |
| 2017/0362747 A1 * | 12/2017 | Krajewski | ...... | D03D 15/00 |
| 2018/0287357 A1 * | 10/2018 | Knudson | ...... | H02G 3/0481 |

\* cited by examiner

WOVEN EMI AND ABRASION RESISTANT SLEEVE AND METHOD OF CONSTRUCTION THEREOF

CROSS-REFERENCE TO RELATED APPLICATION

This application claims the benefit of U.S. Provisional Application Ser. No. 62/481,595, filed Apr. 4, 2017, which is incorporated herein by reference in its entirety.

BACKGROUND OF THE INVENTION

1. Technical Field

This invention relates generally to tubular sleeves for protecting elongate members, and more particularly to woven sleeves that provide protection to elongate members contained therein against abrasion and electromagnetic interference.

2. Related Art

It is known to shield wires against electromagnetic interference (EMI) and abrasion by disposing a protective textile sleeve and a separate outer abrasion resistant tube about the wires. Upon disposing the textile sleeve about the wires and then the abrasion resistant tube about the textile sleeve, the abrasion resistant tube can be heat-shrunk about the textile sleeve. Accordingly, the inner textile sleeve provides the EMI protection, while the heat-shrunk tube provides protection against abrasion. Although such textile sleeves and tubes can prove effective in shielding against EMI and providing protection against abrasion, they are costly from both a material and labor standpoint, having to essentially assembly two separate sleeves about the member being protected. Further yet, upon shrinking the tube about the sleeve, the assembly becomes relatively rigid and inflexible due to the heat-shrunk tubing contracting and hardening, thereby complicating the ability to route the wires over meandering paths and about corners. Further yet, the heat-shrunk tubing makes accessing the wires, such as during repair, difficult if not impossible without first destroying the sleeve.

A protective sleeve manufactured in accordance with the present invention overcomes or greatly minimizes at least those limitations of the prior art described above, as will become readily appreciated by one skilled in the art upon viewing the disclosure herein.

SUMMARY OF THE INVENTION

A textile sleeve for protecting elongate members against EMI is provided. The textile sleeve includes a wall having opposite edges extending lengthwise in generally parallel relation with a longitudinal axis between opposite ends. The opposite edges are configured to overlap one another to bound a central cavity extending between the opposite ends. The wall includes warp filaments, extending generally parallel to the longitudinal axis, woven with weft filaments, extending generally transversely to the warp filaments. The warp filaments include substantially electrically non-conductive multifilaments woven in a plain weave pattern with the weft filaments and electrically conductive members woven with the weft filaments, wherein the electrically conductive members form a plurality of floats, with each of the floats extending over at least two adjacent weft filaments.

In accordance with another aspect of the disclosure, the substantially electrically non-conductive warp multifilaments are unplated and the electrically conductive warp members are metal-plated.

In accordance with another aspect of the disclosure, the metal-plated electrically conductive members can include metal-plated multifilaments.

In accordance with another aspect of the disclosure, the metal-plated multifilaments can include metal-plated aramid multifilaments.

In accordance with another aspect of the disclosure, separate ones of the metal-plated electrically conductive members can include a plurality of metal-plated wires.

In accordance with another aspect of the disclosure, the wires of the plurality of metal-plated wires can include stainless steel wires.

In accordance with another aspect of the disclosure, the wires of the plurality of metal-plated wires of each of the metal-plated electrically conductive members can be metal-plated individually and plied together.

In accordance with another aspect of the disclosure, each of the metal-plated electrically conductive members can include between about 10-30 metal-plated metal wires.

In accordance with another aspect of the disclosure, the metal-plated electrically conductive members can include an outer metal-plating of copper and/or nickel and/or silver.

In accordance with another aspect of the disclosure, the unplated warp multifilaments and metal-plated electrically conductive warp members can be staggered with one another in alternating relation.

In accordance with another aspect of the disclosure, the substantially electrically non-conductive multifilaments can be provided including multifilaments of aramid material.

In accordance with another aspect of the disclosure, an organic or inorganic coating can be applied on the warp and weft filaments to bond the warp and weft filaments together.

In accordance with another aspect of the disclosure, the warp metal-plated electrically conductive members can be woven in a twill pattern.

In accordance with another aspect of the disclosure, the warp metal-plated electrically conductive members can be woven in a satin pattern.

In accordance with another aspect of the disclosure, the floats of the warp metal-plated electrically conductive members can be woven to face radially inwardly toward the cavity to both provide efficient shielding against electromagnetic interferences and to avoid being abraded by elements external to the cavity.

In accordance with another aspect of the disclosure, at least some or all of the weft filaments include heat-set filaments biasing the opposite edges into overlapping relation with one another.

In accordance with another aspect of the disclosure, a method of constructing a textile sleeve for protecting elongate members against abrasion and EMI is provided. The method includes forming a wall having opposite edges extending lengthwise in generally parallel relation with a longitudinal axis extending between opposite ends, with the opposite edges being configured to overlap one another to bound a central cavity extending between the opposite ends. Further, forming the wall by weaving warp filaments extending generally parallel to the longitudinal axis with weft filaments extending generally transversely to the warp filaments. Further yet, weaving the warp filaments including substantially electrically non-conductive multifilaments woven in a plain weave pattern with the weft filaments, and weaving the warp filaments including electrically conductive members forming floats extending over at least two of the weft filaments.

In accordance with another aspect of the disclosure, the method can further include providing the substantially electrically non-conductive multifilaments as unplated multifilaments and providing the electrically conductive members as metal-plated electrically conductive members.

In accordance with another aspect of the disclosure, the method can further include providing the unplated multifilaments as aramid multifilaments.

In accordance with another aspect of the disclosure, the method can further include providing the metal-plated electrically conductive members as metal-plated multifilaments.

In accordance with another aspect of the disclosure, the method can further include providing the metal-plated multifilaments as plated aramid multifilaments.

In accordance with another aspect of the invention, the method can further include providing each of the metal-plated electrically conductive members including a plurality of continuous wire filaments.

In accordance with another aspect of the disclosure, the method can further include providing the plurality of continuous wire filaments within each metal-plated electrically conductive member including stainless steel wire filaments.

In accordance with another aspect of the disclosure, the method can further include providing each of the metal-plated electrically conductive members having between about 10-30 metal-plated metal wire filaments bundled together.

In accordance with another aspect of the disclosure, the method can further include providing the metal-plated electrically conductive members as metal-plated stainless steel wire.

In accordance with another aspect of the disclosure, the method can further include providing the plurality of wires within each metal-plated electrically conductive member being plied together.

In accordance with another aspect of the disclosure, the method can further include providing the metal plating including copper and/or nickel and/or silver.

In accordance with another aspect of the disclosure, the method can further include applying an organic or inorganic coating on the warp and weft filaments to bond the warp and weft filaments with one another.

In accordance with another aspect of the disclosure, the method can further include weaving the metal-plated electrically conductive members in a twill pattern.

In accordance with another aspect of the disclosure, the method can further include weaving the metal-plated electrically conductive members in a satin pattern.

In accordance with another aspect of the disclosure, the method can further include forming the floats of the metal-plated electrically conductive members to face radially inwardly into the cavity.

In accordance with another aspect of the disclosure, the method can further include weaving the non-conductive warp multifilaments and the electrically conductive warp members in staggered, alternating relation with one another such that every other warp filament is formed by one of the non-conductive warp multifilaments and every other warp filament is formed by one of the electrically conductive warp members.

In accordance with another aspect of the disclosure, the method can further include heat-setting at least some or all of the weft filaments to bias the opposite edges into overlapping relation with one another.

BRIEF DESCRIPTION OF THE DRAWINGS

These and other aspects, features and advantages will become readily apparent to those skilled in the art in view of the following detailed description of the presently preferred embodiments and best mode, appended claims, and accompanying drawings, in which:

DETAILED DESCRIPTION OF PRESENTLY PREFERRED EMBODIMENTS

Figure 1:
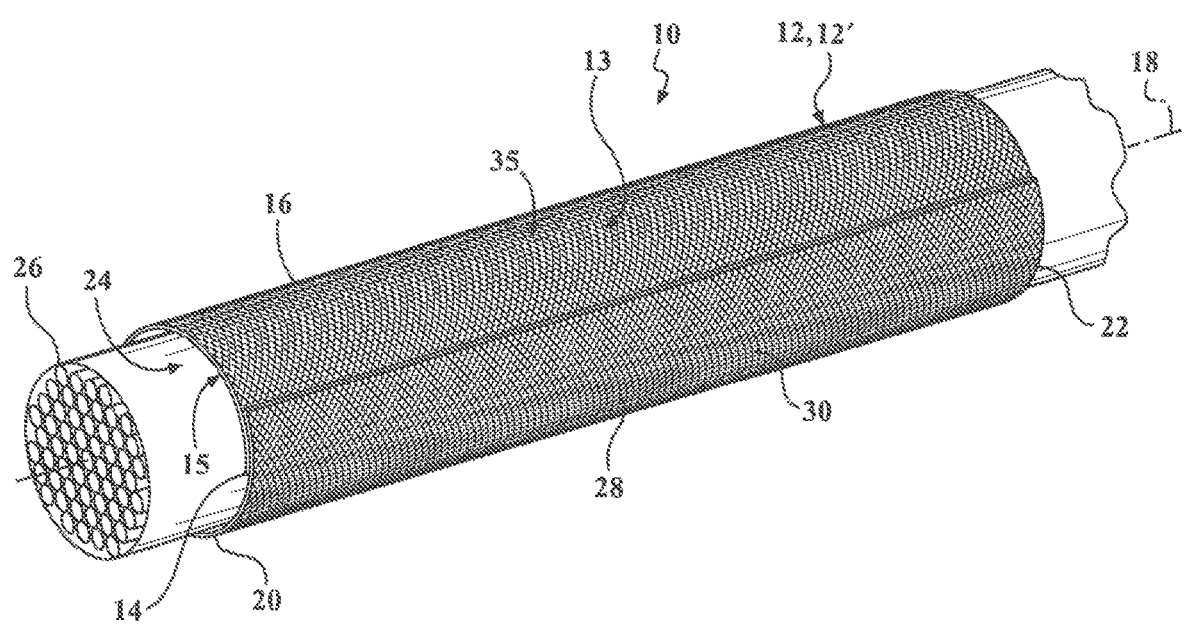
FIG. 1 is a schematic perspective view of a self-wrapping sleeve constructed in accordance with one presently preferred embodiment of the disclosure.
Figure 2:
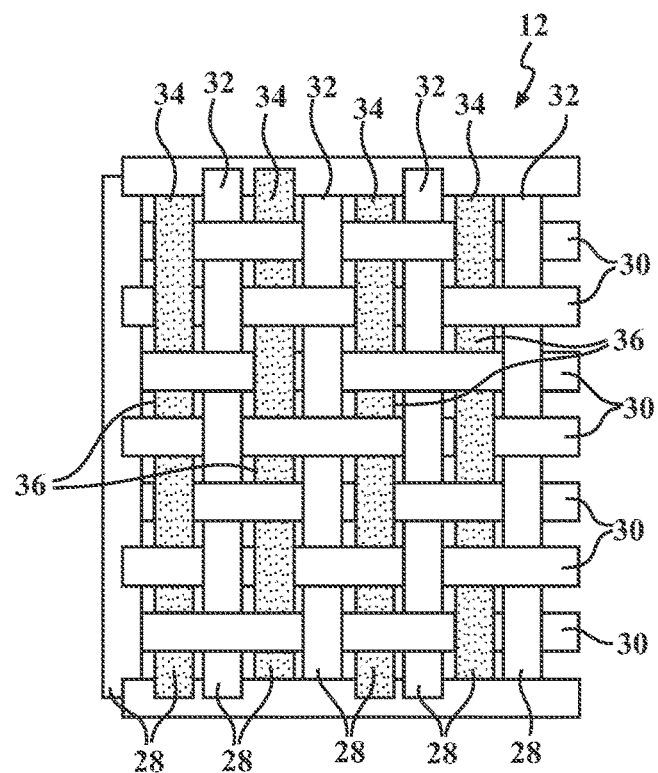
FIG. 2 is an enlarged fragmentary view of an outer surface of a wall of the sleeve of FIG. 1 constructed in accordance with one aspect of the disclosure.
Figure 3:
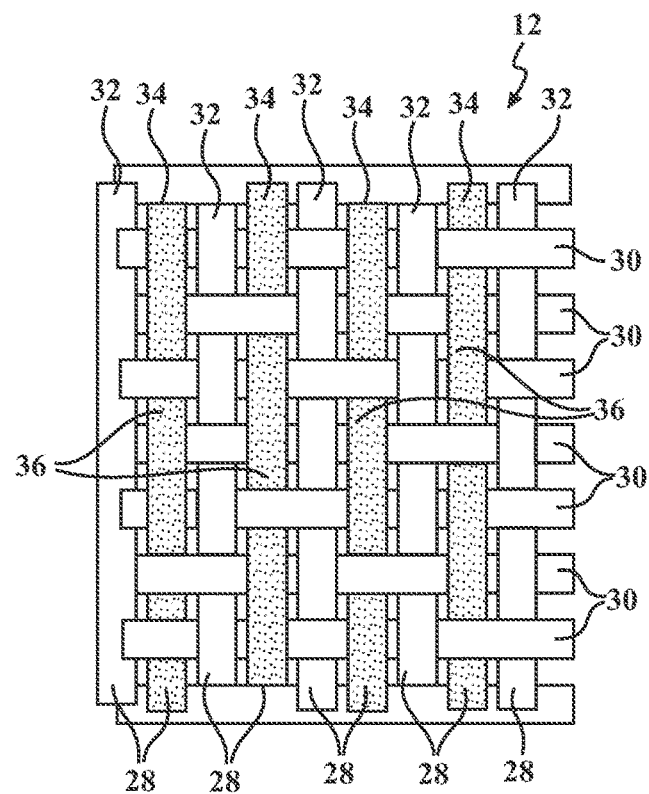
FIG. 3 is an enlarged fragmentary view of an inner surface of the wall of FIG. 2.
Figure 2A:
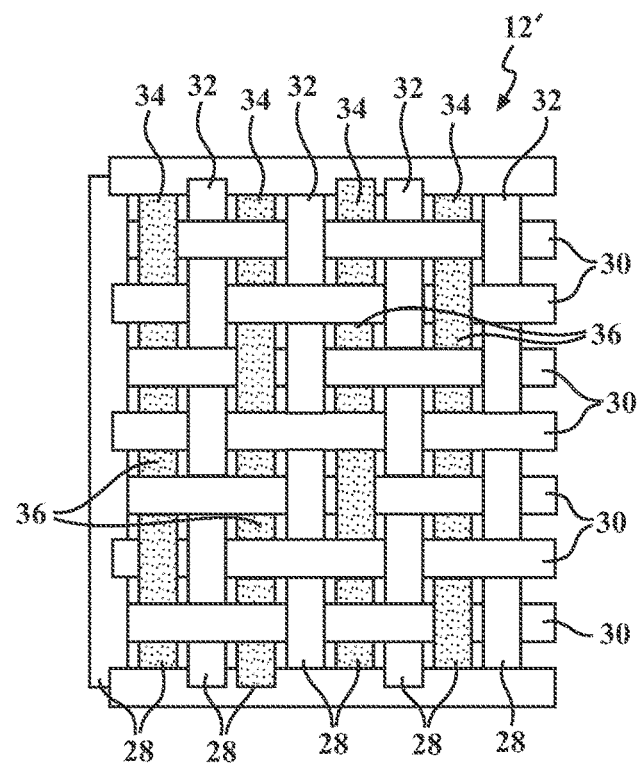
FIG. 2A is an enlarged fragmentary view of an outer surface of a wall of the sleeve of FIG. 1 constructed in accordance with another aspect of the disclosure.
Figure 3A:
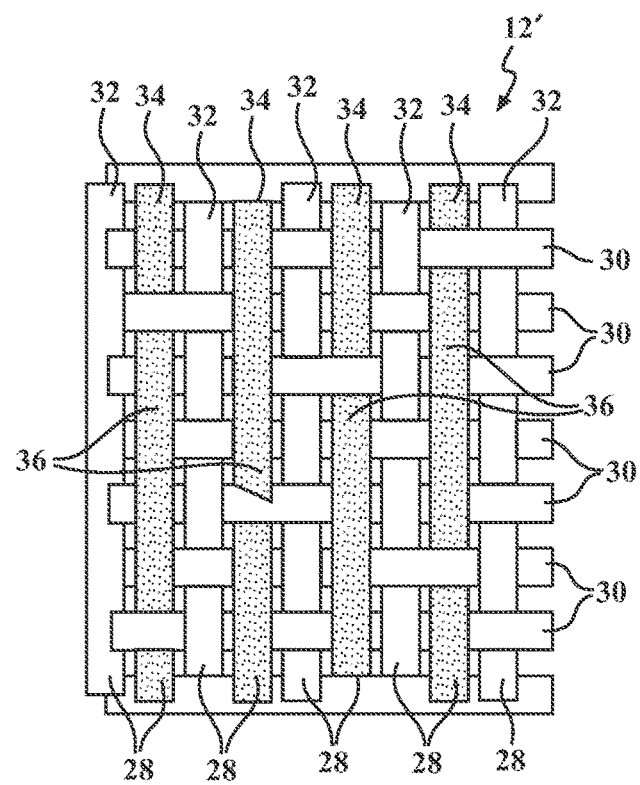
FIG. 3A is an enlarged fragmentary view of an inner surface of the wall of FIG. 2A.

Referring in more detail to the drawings, FIG. 1 shows a self-wrapping sleeve 10 constructed according in accordance with one presently preferred aspect of the disclosure. The sleeve 10 has a wall 12, 12' (two different embodiments discussed below, with the only difference being a weave pattern) with opposite edges 14, 16 extending lengthwise in generally parallel relation with a longitudinal central axis 18 between opposite ends 20, 22. The opposite edges 14, 16 are configured to be wrapped to overlap one another to bound a circumferentially enclosed cavity 24, with the opposite edges 14, 16 and enclosed cavity 24 extending lengthwise between the opposite ends 20, 22, wherein the cavity 24 is sized for protective receipt of an elongate member or members to be protected therein, shown as a cable or a wire harness 26, by way of example and without limitation. The sleeve 10 is particularly well-suited for providing protection to the elongate member 26 against electromagnetic interference (EMI), radio frequency interference (RFI), and/or electrostatic discharge (ESD), as well as against contamination and abrasion. The wall 12, 12' is formed from a plurality of filaments woven with one another, wherein the term filaments is intended to include monofilaments and/or multifilaments, with specific reference being given to the type of filament, as necessary, hereafter, wherein the term "yarn" is used herein to reference both monofilaments and multifilaments. The wall 12, 12' includes warp filaments 28 extending parallel or generally parallel to the longitudinal central axis 18 (generally parallel is intended to mean that the filaments could be less than truly parallel to the longitudinal central axis 18, but that to the naked eye one skilled in the art would commonly refer to the filaments as extending parallel to one another and to the longitudinal central axis 18) woven with weft filaments 30 extending generally transversely to the warp filaments 28. The warp filaments 28 include substantially electrically non-conductive multifilaments 32 (the term "substantially" is intended to mean that although the multifilaments 32 could conduct a minimal electrical current, that one skilled in the art would consider the multifilaments 32 as being "non-conductive") woven in a plain weave pattern with the weft filaments 30 and electrically conductive members 34 woven having a plurality of floats 36, with each of the floats 36 extending over at least two immediately adjacent ones of the weft filaments 30, and shown in one embodiment of the wall 12, as best shown in FIGS. 2 and 3, extending over two weft filaments 30, thereby forming a twill-like float pattern, or, as shown in another embodiment of the wall 12', as best shown in FIGS. 2A and 3A, extending over more than two immediately adjacent ones of the weft filaments 30, thereby forming a satin-like float pattern. The floats 36 are shown as being formed to face radially inwardly toward the longitudinal central axis 18 along an inner surface 15 of the wall 12, 12', thereby avoiding the exposure of the floats 36 along an outer surface 13 of the wall 12, 12' to abrasion from external environmental elements. Accordingly, as will be recognized by the skilled artisan, the electrically conductive members 34, while being able to enhance protection against electrically generated interference, are protected against abrasion and wear due to the minimal exposure of the floats 36 to the outer surface 13 of the wall 12, 12', such that a majority of the length of the electrically conductive members 34 extends along the inner surface 15 of the wall 12, 12'. As such, the combination and synergies formed by the different warp filaments 32, 34 and different weave patterns formed thereby provide enhance protection to the elongate member 26 against abrasion and EMI, respectively.

With the wall 12, 12' being formed as an "open" sleeve, the opposite edges 14, 16 can be configured to be brought into automatic overlapping relation with one another by providing at least one or more, including all of the weft filaments 30 as a heat-settable polymeric filament, such as monofilaments of polyethylene terephthalate (PET) or polyphenylene sulfide (PPS), for example, which can be heat-set at a temperature between about 200-225 degrees Celsius. Once enclosed within the cavity 24 of the sleeve 10, the elongate member 26 receives maximum protection from abrasion and any unwanted electrically generated interference, such as inductive interference, thereby providing any electrical components, such as control motors, for example, connected to the elongate member 26 with maximum operating functionality and efficiency. In addition, the sleeve 10 prevents the bundled elongate member 26 from interfering electrically with any adjacent electrical components.

Figure 4A:
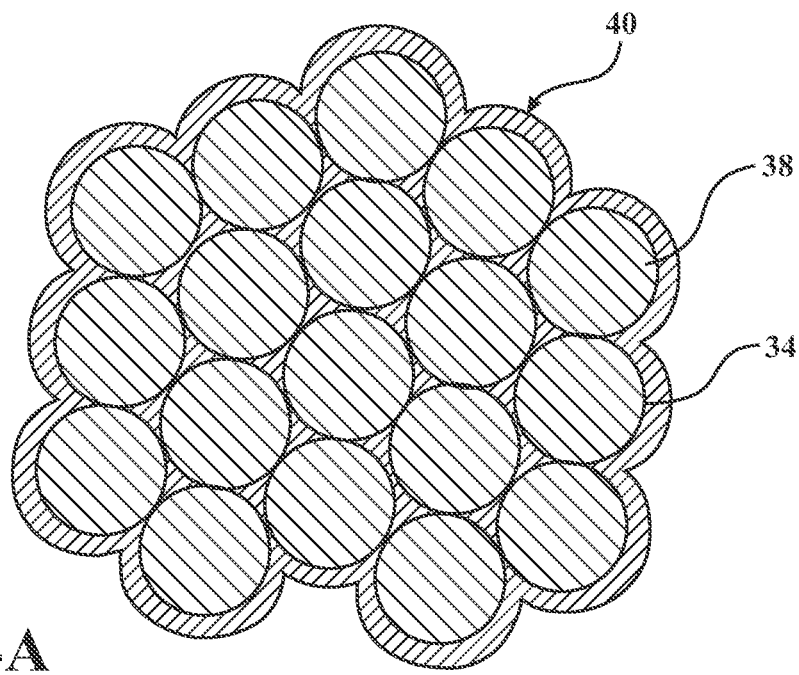
FIG. 4A is an enlarged schematic perspective view of an electrically conductive warp member in accordance in accordance with one aspect of the disclosure.
Figure 4B:
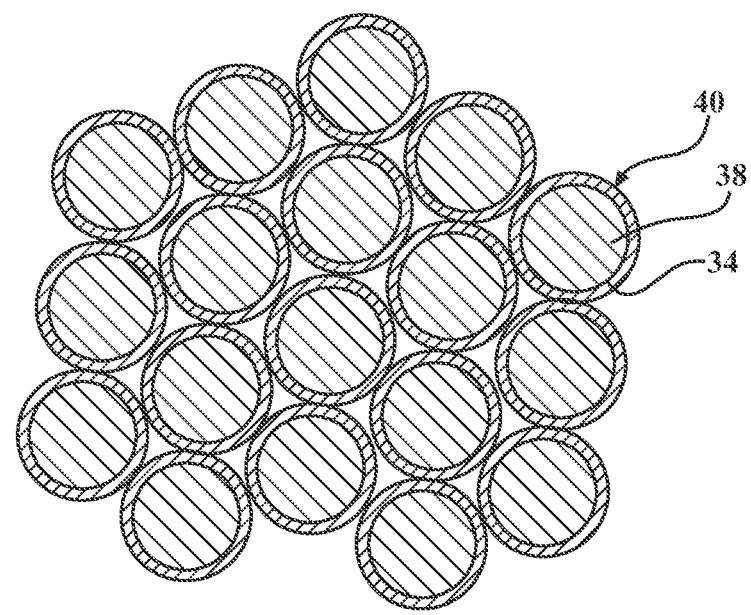
FIG. 4B is a view similar to FIG. 4A of an electrically conductive warp member in accordance in accordance with another aspect of the disclosure.

Depending on the application, the substantially electrically non-conductive warp multifilaments 32 can be formed from, by way of example and without limitation, unplated polyester, nylon, polypropylene, polyethylene, acrylic, m-aramid (Nomex, Conex, Kermel), p-aramid (Kevlar, Twaron, Technora), PEI (Ultem), PPS, and PEEK, for example. Meanwhile, the electrically conductive members 34 can be provided as metal-plated filaments, such as metal-plated multifilaments selected from the types of multifilaments mentioned above for the unplated non-conductive multifilaments. Accordingly, by way of example, the unplated multifilaments 32 could include m-aramid multifilaments, while the metal-plated multifilaments 34 could include metal-plated m-aramid multifilaments, for example. The metal plating can be provided as copper and/or nickel and/or silver-based metal(s), including pure copper and/or pure nickel and/or pure silver, by way of example and without limitation. Further yet, the metal-plated electrically conductive members 34 can be provided as metal-plated wire(s). Accordingly, as shown in FIGS. 4A and 4B, the metal-plated electrically conductive members 34 can each include a plurality of continuous strands of wire filaments 38 that are metal-plated, such as a plurality of continuous strands of stainless steel wire filaments 38 plated with a metal-coating 40 of copper and/or nickel and/or silver-based metal, including pure copper, pure nickel and/or pure silver. It is contemplated herein that the number of wire filaments 38 within each metal-plated electrically conductive member 34 could range between about 10-30 continuous strands of wire filaments 38, with an exemplary embodiment including between about 15-20 wire filaments 38, thereby providing the conductive warp member 34 having a diameter between about 0.005-0.009 inches, by way of example and without limitation. It is further contemplated that the wire filaments 38 can first be bundled, such as in a twisting or braiding process, by way of example and without limitation, and then plated with the selected metal, such as shown in FIG. 4A, or, as shown in FIG. 4B, the individual wire filaments 38 can be first plated with the selected metal and then bundled, such as in a twisting or braiding process, by way of example and without limitation. The unplated, substantially non-conductive warp multifilaments 32 and electrically conductive warp members 34 can be staggered with one another in alternating relation (every other warp filament 28 is a substantially non-conductive warp multifilament 32 and every other warp filament 28 is an electrically conductive member 34) about the entirety of the circumference of the sleeve 10 to provide optimal protection against both abrasion and EMI, RFI, ESD. To further enhance maintaining the desired abrasion resistance and EMI protection, the wall 12, 12' can have an organic or inorganic coating 35 applied thereto to lock or otherwise bond the filaments 28, 30 to one another, thereby maintaining the plated electrically conductive members 34 in their "as woven" relative location with one another. As such, the spaces between alternating plated electrically conductive members 34 can be maintained, thus, assuring the optimal protection against EMI, RFI, ESD is maintained. Further, the coating 35 acts to resist fraying and degradation of the unplated multifilaments, thereby enhancing their resistance to abrasion.

In accordance with another aspect of the disclosure, a method of constructing a textile sleeve 10 for protecting elongate members 26 against abrasion, EMI, RFI, ESD is provided. The method includes forming a wall 12, 12' having opposite edges 14, 16 extending lengthwise in generally parallel relation with a longitudinal central axis 18 between open opposite ends 20, 22, with the opposite edges 14, 16 being configured to overlap one another to bound a central cavity 24 extending between the opposite ends 20, 22. Further, forming the wall 12, 12' by weaving warp filaments 28 extending generally parallel to the longitudinal central axis 18 with weft filaments 30 extending generally transversely to the warp filaments 28, and further, weaving the warp filaments 28 including substantially electrically non-conductive multifilaments 32, as discussed above, woven in a plain weave pattern with the weft filaments 30 (undulating over a single (1) weft filament 30 and under an single (1) weft filament 30 in repeating fashion) and electrically conductive members 34, as discussed above, woven having a plurality of repetitive floats 36, with each float 36 extending over at least two (FIGS. 2 and 3) or more (FIGS. 2A and 3A) immediately adjacent ones of the weft filaments 30, then under a single weft filament 30, then over at least two weft filaments 30 (FIGS. 2 and 3) or more (FIGS. 2A and 3A), and so-on in repeating fashion. The method can further include weaving the floats 36 to extend along an inner surface 15 of the sleeve wall 12, 12' to avoid exposure of the floats 36 and the vast majority of the electrically conductive members 34 to abrasion from external environmental factors, whether from debris and/or neighboring cables, support members and the like. Further yet, the method can include heat-setting at least some or all of the weft filaments 30 to maintain the opposite edges 14, 16 in overlapped relation with one another to bound a central cavity 24 in which the elongate member 26 is received. Additionally, the method can include applying an organic or inorganic protective material coating 35 on the wall 12, 12' to enhance abrasion resistance and EMI protective capabilities thereof.

Obviously, many modifications and variations of the present invention are possible in light of the above teachings. It is, therefore, to be understood that within the scope of the appended claims, the invention may be practiced otherwise than as specifically described, and that is contemplated that all features of all claims and of all embodiments can be combined with each other, so long as such combinations would not contradict one another.

What is claimed is:

1. A textile sleeve for protecting elongate members against abrasion and EMI, comprising:
   a wall having opposite edges extending lengthwise in generally parallel relation with a longitudinal axis between opposite ends, said opposite edges being configured to overlap one another to bound an enclosed cavity extending between said opposite ends, said wall having warp filaments extending generally parallel to said longitudinal axis woven with weft filaments extending generally transversely to said warp filaments, said warp filaments including substantially electrically non-conductive multifilaments woven in a plain weave pattern with said weft filaments and electrically conductive members woven with said weft filaments, wherein said electrically conductive members form a plurality of floats, with each of said floats extending over at least two adjacent ones of said weft filaments.

2. The textile sleeve of claim 1, wherein said electrically conductive members are metal-plated.

3. The textile sleeve of claim 2, wherein said metal-plated electrically conductive members are metal-plated multifilaments.

4. The textile sleeve of claim 3, wherein said metal-plated multifilaments include metal-plated multifilaments of aramid.

5. The textile sleeve of claim 2, wherein separate ones of said metal-plated electrically conductive members include a plurality of metal-plated wires.

6. The textile sleeve of claim 5, wherein said metal-plated wires include metal-plated stainless steel wires.

7. The textile sleeve of claim 5, wherein said plurality of metal-plated wires each include between about 10-30 metal plated wires.

8. The textile sleeve of claim 2, wherein said metal-plated electrically conductive members include an outer plating of at least one of copper, nickel and silver.

9. The textile sleeve of claim 1, wherein said substantially electrically non-conductive multifilaments and said electrically conductive members are staggered with one another in alternating relation.

10. The textile sleeve of claim 1, wherein said substantially electrically non-conductive multifilaments include aramid multifilaments.

11. The textile sleeve of claim 1, further including an organic or inorganic coating bonding said warp and weft filaments together.

12. The textile sleeve of claim 1, wherein said electrically conductive members are woven in a twill pattern.

13. The textile sleeve of claim 1, wherein said electrically conductive members are woven in a satin pattern.

14. The textile sleeve of claim 1, wherein said floats face radially inwardly toward the cavity.

15. The textile sleeve of claim 1, wherein said weft filaments include heat-set filaments biasing said opposite edges into overlapping relation with one another.

16. A method of constructing a textile sleeve for protecting elongate members against abrasion and EMI, comprising:
   forming a wall having opposite edges extending lengthwise in generally parallel relation with a longitudinal axis between opposite ends, with said opposite edges being configured to overlap one another to bound a central cavity extending between said opposite ends;
   forming said wall by weaving warp filaments extending generally parallel along their full length to said longitudinal axis and terminating at said opposite ends with weft filaments extending generally transversely to said warp filaments; and
   weaving said warp filaments including substantially electrically non-conductive multifilaments woven in a plain weave pattern with said weft filaments and including electrically conductive members forming a plurality of floats, with each of said floats extending over at least two adjacent ones of said weft filaments.

17. The method of claim 16, further including weaving said substantially electrically non-conductive multifilaments and said electrically conductive members in staggered, alternating relation with one another.

18. The method of claim 16, further including providing said substantially electrically non-conductive multifilaments as aramid multifilaments.

19. The method of claim 16, further including providing said electrically conductive members as metal-plated filaments.

20. The method of claim 19, further including providing said metal-plated filaments including metal-plated aramid multifilaments.

21. The method of claim 19, further including providing said metal-plated filaments including metal-plated wire filaments.

22. The method of claim 21, further including providing said metal-plated wire filaments including metal-plated stainless steel wire filaments.

23. The method of claim 19, further including providing said metal-plated filaments including an outer plating of at least one of copper, nickel and silver.

24. The method of claim 16, further including applying an organic or inorganic coating on said warp and weft filaments to bond said warp and weft filaments with one another.

25. The method of claim 16, further including weaving said electrically conductive members in a twill pattern.

26. The method of claim 16, further including weaving said electrically conductive members in a satin pattern.

27. The method of claim 16, further including forming said floats to face radially inwardly into the cavity.

28. The method of claim 16, further including heat-setting at least some of said weft filaments to bias said opposite edges into overlapping relation with one another.

* * * * *